United States Patent [19]

Kitcher et al.

[11] 4,203,800

[45] May 20, 1980

[54] REACTIVE ION ETCHING PROCESS FOR METALS

[75] Inventors: James R. Kitcher, Poughkeepsie; Gunars M. Ozols, Wappingers Falls; Bryant N. Zingerman, Monroe, all of N.Y.

[73] Assignee: International Business Machines Corporation, Armonk, N.Y.

[21] Appl. No.: 25,801

[22] Filed: Apr. 2, 1979

Related U.S. Application Data

[63] Continuation of Ser. No. 866,087, Dec. 30, 1977, abandoned.

[51] Int. Cl.$^2$ .................... H01L 21/44; H01L 21/465
[52] U.S. Cl. ................................ 156/643; 156/652; 156/656; 156/657; 156/664; 156/655; 156/668; 204/192 E; 252/79.1; 156/659.1
[58] Field of Search ............... 156/643, 646, 652, 656, 156/657, 664, 665, 668, 659; 252/79.1; 204/192 EC, 192 E, 164

[56] References Cited

U.S. PATENT DOCUMENTS

| | | | |
|---|---|---|---|
| 3,615,956 | 10/1971 | Irving et al. | 156/643 |
| 3,856,648 | 12/1974 | Fuller et al. | 204/192 |
| 3,951,709 | 4/1976 | Jacob | 204/164 |
| 3,971,684 | 7/1976 | Muto | 252/79.1 |
| 3,994,793 | 11/1976 | Haruilchuck et al. | 204/192 |
| 4,026,742 | 5/1977 | Fujino | 252/79.1 |
| 4,030,967 | 6/1977 | Ingrey et al. | 156/646 |

FOREIGN PATENT DOCUMENTS

| | | | |
|---|---|---|---|
| 51-27833 | 3/1976 | Japan | 156/643 |
| 51-50244 | 5/1976 | Japan | 156/646 |

OTHER PUBLICATIONS

Metzger et al., "Etching... Metallurgy", IBM Technical Disclosure Bulletin, vol. 19, No. 9, (Feb. 1977), p. 3366.

*Primary Examiner*—Jerome W. Massie
*Attorney, Agent, or Firm*—David M. Bunnell

[57] ABSTRACT

Metal layers, for example; chromium and titanium-tungsten, used in conductive metallurgies as adhesion or barrier layers for integrated circuit devices which are formed in silicon semiconductor substrates, are selectively etched without significant attack on either the silicon substrate or aluminum conductor layers. The metal layers are exposed to a glow discharge formed by imposing an RF voltage across two spaced electrodes in an ambient atmosphere comprising a gaseous mixture of from about 5 to about 20 percent by volume of a polychlorinated organic compound containing one to two carbon atoms, for example, $CCl_4$ or $C_2HCl_3$ and about 80 to about 95 percent by volume of oxygen at a pressure in the range of about 5 to 50 milli-torr.

11 Claims, 2 Drawing Figures

REACTIVE ION ETCHING PROCESS FOR METALS

This is a continuation, of application Ser. No. 866,087 filed Dec. 30, 1977, now abandoned.

BACKGROUND OF THE INVENTION

The etching of materials in a gas plasma formed from reactive gases is known. These processes can generally be divided into two types, termed "plasma etching" and "reactive ion etching". In plasma etching, the workpiece is placed in a chamber and a glow discharge is maintained by supplying RF energy to an electrode or electrodes which are external to the chamber. Typical power levels are 100 to 400 watts at 13.5 MHz and pressures are 0.05 to a few torr. An example of this apparatus and process is shown in U.S. Pat. No. 3,951,709. In reactive ion etching, the workpiece is placed on an electrode in a chamber and a glow discharge is maintained by supplying RF energy to the electrode. Typical power levels are 0.1 to 0.5 watts/cm$^2$ at 13.5 MHz and pressures are 5 to 50 milli-torr. The reactive ion etching process provides directional etching. An example of this process and apparatus is shown, for example, in U.S. Pat. No. 3,994,793.

U.S. Pat. No. 3,951,709 discloses a process for forming semiconductor photomasks by etching metal layers, such as chromium or gold, on glass by a plasma etching process using gas mixtures of chlorine compounds such as CCl$_4$ and C$_2$HCl$_3$ mixed with oxygen. U.S. Pat. No. 3,994,793 discloses a process for selectively etching aluminum and aluminum alloys by a reactive ion etching process using a halogen containing gas mixture such as CCl$_4$ and argon.

In forming conductive metallurgy patterns for integrated circuits of, for example, aluminum, problems of poor adhesion of the metallurgy to dielectric layers and of contamination of the semiconductor by alloying with the conductor metallurgy can occur. Therefore, auxiliary barrier layers of metals such as chromium, titanium, tungsten, and tantalum are used. These metal layers must be etched without significant attack on either the aluminum metallurgy or the silicon substrate. Chlorine containing gases are known to rapidly attack silicon, for example, see U.S. Pat. No. 3,615,956, column 5, line 24-26.

We have discovered a process employing gas mixtures of organic chlorine compounds, such as, CCl$_4$ or C$_2$HCl$_3$ and oxygen in certain critical proportions which do not significantly etch aluminum or silicon while reactively ion etching the barrier metal layers.

BRIEF SUMMARY OF THE INVENTION

In accordance with the invention a process is provided for selectively removing a metal layer from a workpiece which includes silicon, without significant etching of the silicon, comprising placing the workpiece, having a metal layer which is selected from the group consisting of chromium, titanium, tungsten, tantalum and alloys thereof, on a first electrode means in a chamber and subjecting the metal layer to a glow discharge formed by electrically biasing the electrode means relative to a second electrode means in a reactive gas atmosphere at low pressures. The reactive gas atmosphere comprises a gaseous mixture of from about 5 to about 20% by volume of a polychlorinated organic compound containing 1 to 2 carbon atoms and about 80 to about 95% by volume of oxygen at a total pressure in the range of about 5 to 50 milli-torr.

DETAILED DESCRIPTION

The process to etch chromium, titanium, tungsten, tantalum metal layers and alloys thereof is carried out in a reactive ion etch system. The reactive ion etch system provides directional etching which results in straighter etched sidewalls so that better replication of the overlying resist pattern is obtained when compared to, for example, wet etcing or plasma etching. The latter processes are non-directional in that the sidewalls under the resist mask are subject to etching. Also, metal layers such as titanium-tungsten alloys could not be etched using mixtures C$_2$HCl$_3$ and oxygen in a plasma system.

Figure 1:
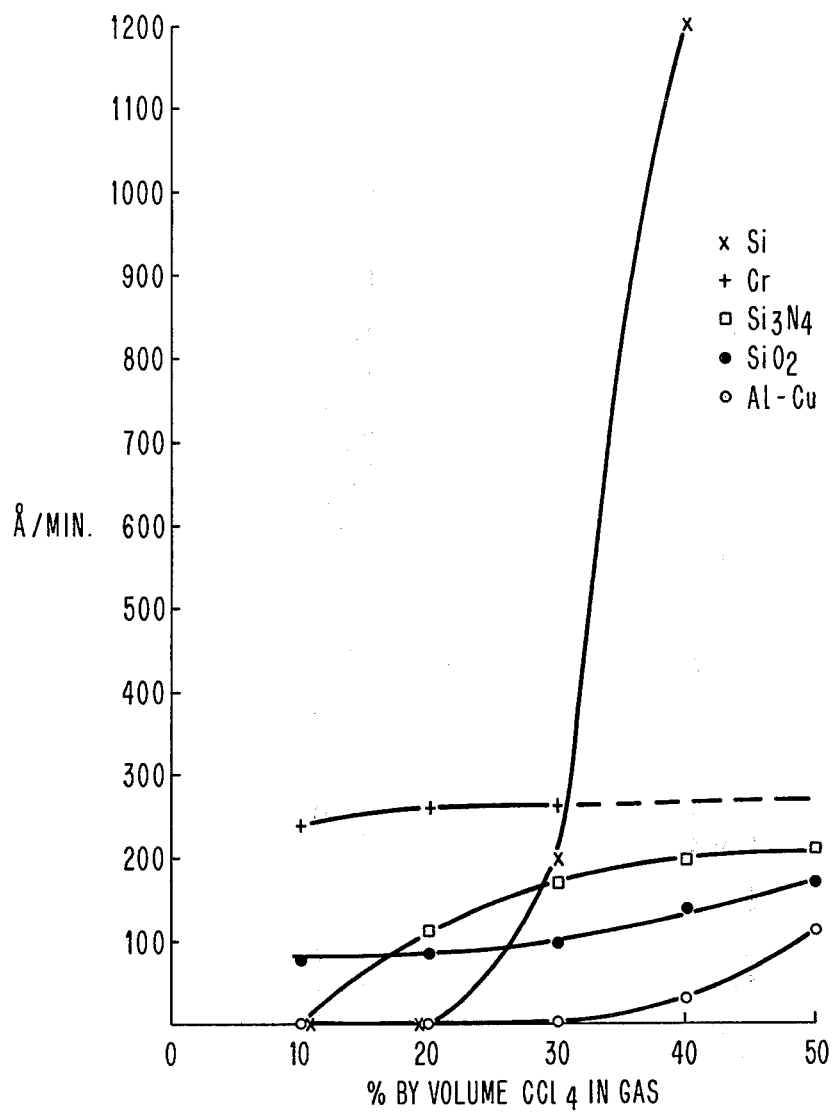
FIG. 1 is a graph showing etch rates of different materials at various concentrations of CCl$_4$ and O$_2$.

Suitable reactive ion etch tools are known in the art and a reactive ion etch system is schematically shown, for example, in FIG. 1 of U.S. Pat. No. 3,994,793 whose teachings are hereby incorporated by reference. In the reactive ion etching system and process, the substrate to be etched is placed on a plate on a cathode which is connected to an RF power source. The plate can be of various materials such as, for example, quartz, silicon, and aluminum. The reactive ion etch process is carried out at pressures from about 5 to 50 milli-torr with pressures of 10 to 30 milli-torr being preferred in the process of the invention. Power densities range from about 0.1 to 0.5 watts/cm$^2$, with a preferred power density being about 0.25 watts/cm$^2$ where organic masking layers are used in order to avoid excessive loss of resist thickness. Auxiliary heating of the cathode plate to raise the temperature of the substrate can be employed in order to increase the etch rates. Because the photoresist tends to degrade at higher temperatures, a trade-off between etch rate and loss of resist thickness must be made.

The gas compositions suitable for the practice of the process of the invention are volatile polychlorinated organic materials having 1 to 2 carbon atoms, for example, CCl$_4$ and C$_2$HCl$_3$ which are mixed with oxygen. It is known that the polychlorinated compounds rapidly attack silicon and aluminum but, surprisingly, we have found that by employing no more than about 20% of the polychlorinated compound, the etching of silicon or aluminum is not significant while the barrier metal layers of chromium, tungsten, titanium, tantalum and alloys thereof can be etched at a reasonable rate of, for example, about 250 to 600 Å per minute. At concentrations above about 20%, the rate of silicon etch becomes significant (above about 50 Å per minute) and at 30% approaches the rate of the metal etch. The exact upper limit to avoid significant etching of silicon appears to be system and sample dependent but is around 20 percent by volume. At about 40% of polychlorinated compound, the etch rate of silicon becomes over 1000 Å per minute as illustrated in the graph of FIG. 1. Also, silicon oxide and silicon nitride layers etch at a much slower rate than that of chromium using the process of the invention. Therefore, these layers, which are commonly employed as dielectric layers on the surface of silicon to insulate the conductor metallurgy layers from the silicon devices and to separate different levels of metallurgy, are not excessively attacked. The etch rate ratios between the dielectric layers and the barrier metal layers has been found to be somewhat dependent upon the presence or absence of photo-resist masking layers. Where photoresist masking is used, even more favorable etch rate ratios than shown in the graph of FIG. 2 have been obtained in that etch rates of barrier metal in the range of 400 to 500 Å are obtained with dielectric layer etch rates being at or below about 50 Å per minute. The conditions of operation of the reactive ion etch, or diode tool, used in obtaining the data illustrated in FIG. 1 were a total pressure of 10 milli-torr, a power density of 0.25 watts/cm$^2$, and a substrate temperature at the start of 160° C.

Figure 2:
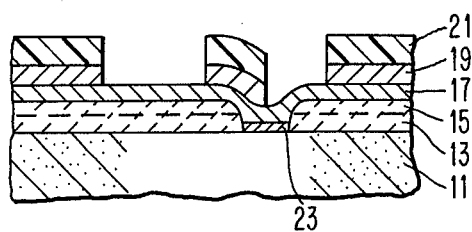
FIG. 2 is a cross-sectional view of a device structure illustrating an application of the process of the invention.

In the more specific aspects of the process of the invention, a way of etching conductive metallurgy patterns formed on semiconductor wafers, having various active and passive components formed in the wafer surface, is provided. Generally, the wafers are covered with dielectric insulating layer structures having contact holes to the silicon surface. A typical structure would be a first layer of about 5000 Å of silicon dioxide thermally grown on the silicon surface covered by a pyrolytically deposited layer of silicon nitride having a thickness of about 16000 Å. Blanket layers of metal are then formed over the dielectric layer and the contact holes. The metal layers are covered with a patterned resist in order to expose the metal where it is to be removed in order to form the conductor line structure. A typical conductor metallurgy structure would be a relatively thick layer of aluminum, or aluminum-copper alloy, formed over a layer of chromium or titanium-tungsten which serves as a barrier and adhesion layer so that the aluminum-copper metallurgy will adhere to the surface and prevent interaction between the aluminum conductor layer and the silicon substrate. The aluminum can be etched by the process of U.S. Pat. No. 3,994,793 using a chlorine containing ambient in the reactive ion etch tool. It is then necessary to remove the underlying barrier metal layer without either excessive undercutting of the aluminum layer or attack on the underlying silicon substrate. Where platinum silicide is formed in the contact holes, this material will normally protect the silicon from the etching gas even if the resist mask is offset so that the conductor line does not completely cover the contact opening as shown in FIG. 2. However, gaps can occur in the platinum silicide so that the silicon substrate is exposed to the plasma and would be attacked if it was subject to etching by the gas mixture employed to etch the metal layer. The process of the invention, by employing particular gas compositions, permits the etching of the metal layer without significant attack of either the aluminum metallurgy or the silicon substrate.

The process also lends itself to the sequential etching of metal layers in the reactive ion etch tool. Aluminum can be etched in, for example, $CCl_4$ and argon until metal layer, such as, the chromium is reached as indicated by a change in reflectivity sensed by a reflectometer. The gas atmosphere is then changed to a mixture of, for example, about 20% $CCl_4$ and 80% oxygen by volume by stopping the flow of argon and adding oxygen instead to etch the chromium, and finally the gas is changed to oxygen or other suitable gas to strip the resist. This sequence is found to minimize problems of corrosion caused by the high absorbtion of chlorine or chromium during the aluminum etching which can cause rapid reaction of the chlorine with aluminum which occurs if an attempt is made to move the wafer to a different processing tool in order to accomplish the chromium etch.

The invention is further illustrated by, but is not intended to be limited to, the following examples.

EXAMPLE I

The etch rate data described in FIG. 1 was obtained by placing silicon wafers or portions of silicon wafers having as the top coating the material on which the etch rate was to be determined into the reactive ion etch chamber with substrate preheating to 160° C. The total pressure was 10 milli-torr, the power density was 0.25 watts/cm$^2$ and the gas compositions ranged from 10 to 50% by volume $CCl_4$ with the remainder oxygen. The samples were masked by placing an approximately 500×500 mil silicon chip having a thickness of about 15 mil on top of the substrate in order to mask that area from the reactive ion etching plasma. The step created by the etching process was measured by a taly step. The etching times were from about 2 to 5 minutes and the average etch rates were determined by dividing the etch time into the taly step measured steps created by the etching of the material surface in the areas which were not protected by the silicon chip. It can be seen that, at concentrations of $CCl_4$ of 20% and below, no measured etching of silicon was observed and below 30% no measured etching of aluminum-copper was observed. The etch rate for chromium, on the other hand, was approximately constant between 10 and 30% by volume $CCl_4$ at around 250 A per minute. It is apparent that concentrations of $CCl_4$ below 10% by volume would be effective to etch chromium.

EXAMPLE II

A sample silicon wafer having layers of thermal oxide and pyrolytically deposited silicon nitride thereon with a 500 Å thick layer of tantalum on the nitride, a 1000 Å thick layer of TiW (10% Ti) on top of the tantalum, a 1 micron thick layer of aluminum-copper on top of the titanium-tungsten layer with the structure being masked by a 1 micron thick layer of Shipley AZ1350 photoresist. The resist is patterned to expose portions of the aluminum-copper layer and the aluminum-copper is etched to the titanium-tungsten surface in the reactive ion etch system on a quartz plate with a gas ambient of $CCl_4$ and argon as described in U.S. Pat. No. 3,994,793. The titanium-tungsten and tantalum layers were then removed by changing to a gas ambient of a mixture of 20% $CCl_4$ and 80% oxygen by volume at a total pressure of 10 torr down to the silicon nitride surface. The reactor conditions were as in Example I with the power density of about 0.25 watts/cm$^2$ and the substrate was preheated to 160° C.

EXAMPLE III

In order to further illustrate the etch rates in various gas mixtures, silicon wafers having the top surface layers listed in Table I were etched with different gas mixtures. The samples in each case were partially masked with about 1 to 2 micron thick layers of resist. After etching, the resist was stripped in an oxygen plasma and the etch step measured by taly step to determine the etch rates. The power density was 0.25 watts/cm$^2$ and the samples were preheated to about 160° C. The silicon was a polished p$^-$ substrate, the silicon oxide was about a 5000 Å thick layer of thermally grown oxide and the silicon nitride was about a 1600 Å thick layer of pyrolytically deposited material. The metal films were about 1000 Å thick films prepared, in the case of titanium-tungsten by DC sputter deposition onto silicon dioxide coated silicon, and in the case of chromium, E-beam sublimation from a chromium source onto oxide coated silicon.

TABLE 1

| Etchant Gas Mixture in Milli-Torr | | | Etch Rate Å/min | | | | |
|---|---|---|---|---|---|---|---|
| $C_2HCl_3$ | $CCl_4$ | $O_2$ | Cr | TiW* | Si | $SiO_2$ | $Si_3N_4$ |
| 10 | — | 10 | 225 | — | 1000 | 125 | 190 |
| 5 | — | 15 | 400 | — | 100 | 10 | 15 |
| 2 | — | 8 | 400 | — | 50 | 50 | 50 |
| 5 | — | 5 | 180 | — | 580 | 200 | 150 |
| 10 | — | 10 | — | 375 | 447 | 133 | — |
| — | 5 | 15 | 400 | — | 100 | 50 | 50 |
| — | 2 | 18 | 293 | — | <20 | <20 | <20 |
| — | 2 | 8 | 425 | — | 25 | 25 | 25 |
| — | 2 | 8 | 260 | 220 | <25 | <25 | — |
| — | 5 | 5 | 490 | — | 1150 | 125 | 220 |
| — | 5 | 5 | 260 | 1900 | — | <25 | — |
| — | 3 | 7 | 233 | 1300 | — | <25 | — |

*10 and 30% Ti

As can be seen from the results listed in Table 1, concentrations of the chlorine containing gas of 20% and below gave chromium etch rates of about 250 to 400 Å per minute with etch rates of silicon of about 50 to below 20 Å per minute. The etch rate ratios of chromium to oxide and nitride at these gas compositions were also very favorable. It can be seen that concentrations of 25% and 50% of the chlorine containing gas significant etching of the silicon occurs. The rates are about 100 Å per minute at 25% and rapidly increase to about 1000 Å per minute or more at concentrations of 50% by volume.

The TiW etch rate also appears to drop off at lover concentrations of $CCl_4$ with some data giving etch rates of over 1000 Å/min. at concentrations of 30 and 50% by volume of $CCl_4$. For etching TiW to completion, without significant etching of silicon, concentrations at around 20% are therefore, preferred.

EXAMPLE IV

FIG. 2 illustrates a typical conductor metallurgy structure which can be etched by the process of the invention. On silicon substrate 11 are formed a 2000 Å thick layer 13 of thermal oxide, a 1600 Å thick layer 15 of pyrolytically deposited silicon nitride, a 1000 Å thick layer 17 of chromium and a 10,000 Å thick layer 19 of aluminum-copper. A resist mask 21 is formed over the aluminum layer 19 and patterned to expose layer 19 where it is to be removed by etching. A layer 23 of platinum silicide is formed in contact hole 25. As shown, the aluminum layer is etched to the chromium layer in the exposed portions. The resist mask only partially overlaps the contact hole area so that a portion of chromium over the platinum silicide is exposed. The substrate is placed on a quartz plate at the cathode and preheated to 160° C. The aluminum-copper is etched with a mixture of 2 milli-torr of $CCl_4$ and 8 milli-torr of argon in about 9 minutes and then, without shutting off the plasma, the argon is exchanged for 8 milli-torr of oxygen in the etching ambient atmosphere and the chromium is etched in about 2 minutes 45 seconds. (It was noted that a ring of unetched chromium remains around the patterned aluminum-copper if the glow is shut off during the exchange). The resist is stripped in oxygen at 20 milli-torr pressure in about 20 minutes. The RF power throughout was 180 watts (0.25 watts/cm$^2$).

The process of the invention permits the etching of metals, such as, chromium, tungsten, titanium, and tantalum without significant attack on aluminum-copper, silicon and dielectric layers such as silicon dioxide and silicon nitride during the formation of conductor metallurgy for integrated circuits.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A process for removing a metal layer from a workpiece which includes silicon, without significant etching of silicon which is exposed to the etching gas plasma for the metal layer, comprising placing the workpiece having a metal layer which is selected from the group consisting of chromium, titanium, tungsten, tantalum and alloys thereof, on a first electrode in a chamber and subjecting the metal layer to a glow discharge formed by electrically biasing the first electrode relative to a second electrode, in a low pressure ambient atmosphere comprising a gaseous mixture of from about 5 to about 20 percent by volume of a polychlorinated organic compound containing one to two carbon atoms and about 80 to about 95 percent by volume of oxygen, said ambient atmosphere having a pressure in the range of about 5 to 50 milli-torr.

2. The process of claim 1 wherein the polychlorinated organic compound is $CCl_4$.

3. The process of claim 1 wherein the polychlorinated organic compound is $C_2HCl_3$.

4. The process of claim 1 wherein the gaseous mixture is about 10 to 20 volume percent $CCl_4$ and about 80 to 90 volume percent oxygen, the total pressure is about 10 to 20 milli-torr, the glow discharge is formed by applying a RF potential to the first electrode to provide a power density of about 0.1 to 0.5 watts/cm$^2$.

5. The process of claim 1 wherein the gaseous mixture is about 10 to 20 volume percent $C_2HCl_3$ and about 80 to 90 volume percent oxygen, the total pressure is about 10 to 20 milli-torr, the glow discharge is formed by applying a RF potential to the first electrode to provide a power density of about 0.1 to 0.5 watts/cm$^2$.

6. The process of claim 1 wherein a mask is formed over the metal layer which leaves portions of the metal layer exposed to the glow discharge.

7. The process of claim 6 wherein the workpiece is a silicon substrate having a dielectric layer containing openings for electrical contact to the silicon surface and the metal layer is a blanket layer covering the dielectric layer and the openings.

8. The process of claim 6 wherein the mask includes a layer containing aluminum formed on the metal layer.

9. The process of claim 6 wherein the metal layer is a titanium-tungsten alloy and the gaseous mixture is about 20 percent by volume of polychlorinated organic compound and about 80 percent by volume oxygen.

10. The process of claim 6 wherein the workpiece includes a layer containing aluminum between the mask and the metal layer and the layer containing aluminum is first reactively ion etched in a low pressure ambient atmosphere of $CCl_4$ and argon and the metal layer is then etched, without shutting off the glow discharge, by substituting oxygen for the argon in the atmosphere.

11. The process of claim 10 wherein the mask is photo-resist and, following the metal etch, the mask is stripped in an oxygen plasma without removing the workpiece from the chamber.

* * * * *